US008149010B2

(12) United States Patent
Kang et al.

(10) Patent No.: US 8,149,010 B2
(45) Date of Patent: Apr. 3, 2012

(54) METHOD FOR DETECTING STORAGE VOLTAGE, DISPLAY APPARATUS USING THE STORAGE VOLTAGE AND METHOD FOR DRIVING THE DISPLAY APPARATUS

(75) Inventors: Shin Tack Kang, Seongnam-si (KR); Bong Jun Lee, Seoul (KR); Sang Yong No, Seoul (KR); Kwan Ho Kim, Cheonan-si (KR); Jong Hwan Lee, Anyang-si (KR); Sun Hyung Kim, Seoul (KR)

(73) Assignee: Samsung Electronics Co., Ltd. (KR)

( * ) Notice: Subject to any disclaimer, the term of this patent is extended or adjusted under 35 U.S.C. 154(b) by 388 days.

(21) Appl. No.: 12/033,363

(22) Filed: Feb. 19, 2008

(65) Prior Publication Data

US 2008/0316383 A1 Dec. 25, 2008

(30) Foreign Application Priority Data

Jun. 20, 2007 (KR) ........................ 10-2007-0060353

(51) Int. Cl.
*G01R 31/26* (2006.01)

(52) U.S. Cl. .............................. 324/760.01; 324/760.02

(58) Field of Classification Search .................. 324/770, 324/765, 158.1, 760, 762.01–762.1, 760.01–760.02; 257/48; 438/14–18; 349/192, 187, 54, 152
See application file for complete search history.

(56) References Cited

U.S. PATENT DOCUMENTS 5,377,030 A * 12/1994 Suzuki et al. ................. 349/187
6,794,892 B2 * 9/2004 Matsueda ..................... 324/770
7,777,824 B2 * 8/2010 Jeong et al. ..................... 349/54

* cited by examiner

*Primary Examiner* — Jermele M Hollington
*Assistant Examiner* — Tung X Nguyen
(74) *Attorney, Agent, or Firm* — Cantor Colburn LLP

(57) ABSTRACT

A method for detecting a storage voltage, a display apparatus using the storage voltage and a method for driving the display apparatus. The method for detecting the storage voltage includes applying a test voltage to a storage line in a display panel having an active layer disposed between the storage line and a data line while varying the test voltage, the active layer being in an active state or an inactive state according to the test voltage, and detecting the storage voltage corresponding to the test voltage in an inactive state of the active layer. Thus, the display panel is driven by using the detected storage voltage, so that an aperture ratio may be increased and current consumption may be decreased.

13 Claims, 6 Drawing Sheets

METHOD FOR DETECTING STORAGE VOLTAGE, DISPLAY APPARATUS USING THE STORAGE VOLTAGE AND METHOD FOR DRIVING THE DISPLAY APPARATUS

This application claims priority to Korean Patent Application No. 2007-60353, filed on Jun. 20, 2007, all of the benefits accruing therefrom under 35 U.S.C. §119, the contents of which in its entirety is incorporated herein by reference.

BACKGROUND OF THE INVENTION

1. Field of the Invention

The present invention relates to a method for detecting a storage voltage, a display apparatus using the storage voltage and a method for driving the display apparatus. More particularly, the present invention relates to a method for detecting a storage voltage applied to a storage line to form a storage capacitor, a display apparatus using the storage voltage and a method for driving the display apparatus.

2. Description of the Related Art

A liquid crystal display ("LCD") apparatus is a display apparatus which displays an image, and includes a display substrate, a counter substrate facing the display substrate, and a liquid crystal layer disposed between the display substrate and the counter substrate.

Conventionally, the display substrate includes a gate line, a data line, a storage line, a thin-film transistor ("TFT") and a pixel electrode which are formed on a transparent substrate, to independently drive a plurality of pixels. The counter substrate includes a color filter layer having a red color filter (R), a green color filter (G) and a blue color filter (B), a black matrix disposed at border portions between the color filters, and a common electrode opposite to the pixel electrode.

Recently, a structure in which a storage line formed with the gate line partially overlaps with the data line has been developed to prevent light leakage and to increase an aperture ratio.

However, when a four-mask method is performed through which the data line and an active layer are formed using one mask, an active layer disposed under the data line protrudes to an outline of the data line. Accordingly, a distance between the pixel electrode and the data line is increased to correspond to the protruded length of the active layer, to prevent parasitic capacitance generated between the pixel electrode and the data line from being increased, so that the aperture ratio may be decreased.

BRIEF SUMMARY OF THE INVENTION

The present invention has made an effort to solve the above stated problems and aspects of the present invention provide a method for detecting a storage voltage to prevent an active layer from being activated to form a conductor, a display apparatus using the storage voltage, and a method for driving the display apparatus using the storage voltage.

In an exemplary embodiment, the present invention provides a method for detecting the storage voltage, the method includes applying a test voltage to a storage line in a display panel having an active layer disposed between the storage line and a data line while varying the test voltage, the active layer being in an active state or an inactive state according to the test voltage, and detecting the storage voltage corresponding to the test voltage in an inactive state of the active layer.

According to an exemplary embodiment, detecting the storage voltage includes measuring a current consumption of the display panel, which is changed according to a change of the test voltage, and determining the storage voltage based on the current consumption.

According to an exemplary embodiment, determining the storage voltage includes determining the storage voltage to be a same as or less than the test voltage corresponding to a start point at which the current consumption which is saturated as the test voltage is decreased, starts to be rapidly decreased.

Alternatively, according to another exemplary embodiment, determining the storage voltage includes determining the storage voltage to be a same as or less than the test voltage corresponding to a start point at which the current consumption which is rapidly decreased as the test voltage is decreased, starts to be saturated.

According to another exemplary embodiment, the present invention provides a display apparatus which includes a display substrate having an active layer disposed between a storage line and a data line, and a power supplying part which supplies a storage voltage to the storage line, the active layer being in an inactive state by the storage voltage.

According to an exemplary embodiment, the storage voltage is in a range between approximately −20 V and approximately 12 V. According to an exemplary embodiment, the storage voltage is in a range between approximately −20 V and approximately 0 V.

According to an exemplary embodiment, the display substrate includes a first metal pattern formed on a substrate, and including a gate line and the storage line, the gate line receives a gate signal provided from the power supplying part, a first insulating layer formed on the substrate on which the first metal pattern is formed, a second metal pattern formed on the first insulating layer, and including a data line at least partially overlapping with the storage line and receiving a data signal provided from the power supplying part, a second insulating layer formed on the substrate on which the second metal pattern is formed, and a pixel electrode formed on the second insulating layer corresponding to each pixel, and partially overlapping with the storage line. According to an exemplary embodiment, the active layer is formed between the first insulating layer and the second metal pattern. In addition, the active layer includes an active protrusion portion which protrudes to an outside of the second metal pattern.

According to an exemplary embodiment, the storage line includes a storage portion which extends parallel with the gate line, and a light-blocking portion which extends along the data line from the storage portion and overlaps with the data line.

According to an exemplary embodiment, a width of the light-blocking portion is larger than that of the data line and that of the active layer.

In another exemplary embodiment, the present invention provides a method for driving the display apparatus, the method includes applying a gate signal to a gate line to turn on a thin-film transistor, applying a data voltage to a data line overlapping with an active layer and a storage line, to transmit the data voltage to a pixel electrode when the thin-film transistor is turned on, and applying a storage voltage in a range between approximately −20 V and approximately 12 V to the storage line forming the pixel electrode and a storage capacitor, to maintain the data voltage transmitted to the pixel electrode for one frame.

According to an exemplary embodiment, applying a storage voltage includes applying a storage voltage which is in a range between approximately −20 V and approximately 0 V to the storage line.

According to the present invention, an aperture ratio may be increased and current consumption may be decreased.

BRIEF DESCRIPTION OF THE DRAWINGS

The above and/or other aspects, features and advantages of the present invention will become more apparent from the following detailed description when taken in conjunction with the accompanying drawings, in which.

DETAILED DESCRIPTION OF THE INVENTION

Figure 1:
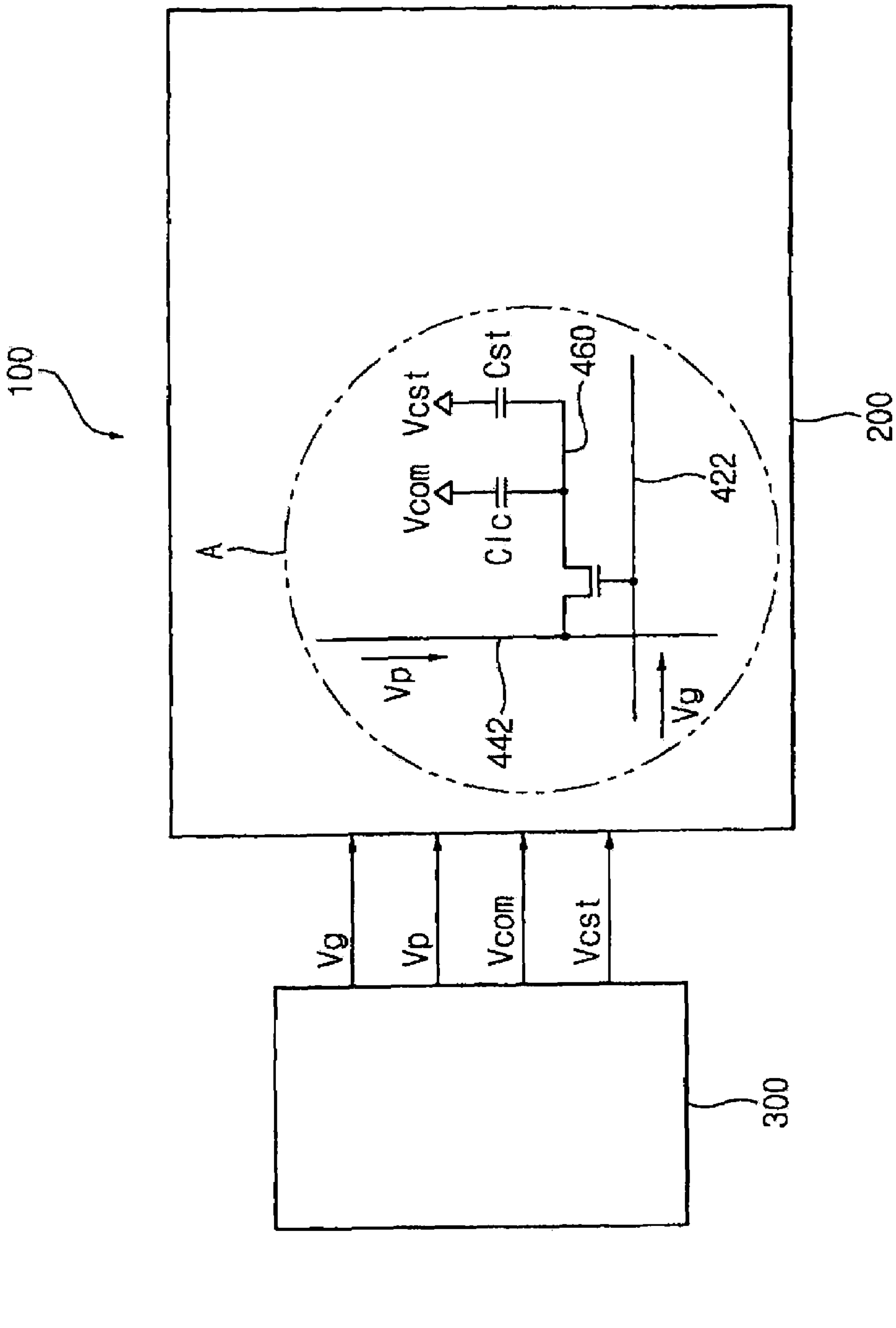
FIG. 1 is a block diagram illustrating an exemplary embodiment of a display apparatus according to the present invention.

The present invention will now be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity.

It will be understood that when an element or layer is referred to as being “on,” “connected to” or “coupled to” another element or layer, it can be directly on, connected or coupled to the other element or layer or intervening elements or layers may be present. In contrast, when an element is referred to as being “directly on,” “directly connected to” or “directly coupled to” another element or layer, there are no intervening elements or layers present. Like numbers refer to like elements throughout. As used herein, the term “and/or” includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as “beneath,” “below,” “lower,” “above,” “upper” and the like, may be used herein for ease of description to describe one element or feature’s relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as “below” or “beneath” other elements or features would then be oriented “above” the other elements or features. Thus, the term “below” can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms “a,” “an” and “the” are intended to include the plural forms as well, unless the context clearly indicates otherwise. It will be further understood that the terms “comprises” and/or “comprising,” when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, the present invention will be explained in detail with reference to the accompanying drawings.

Figure 2:
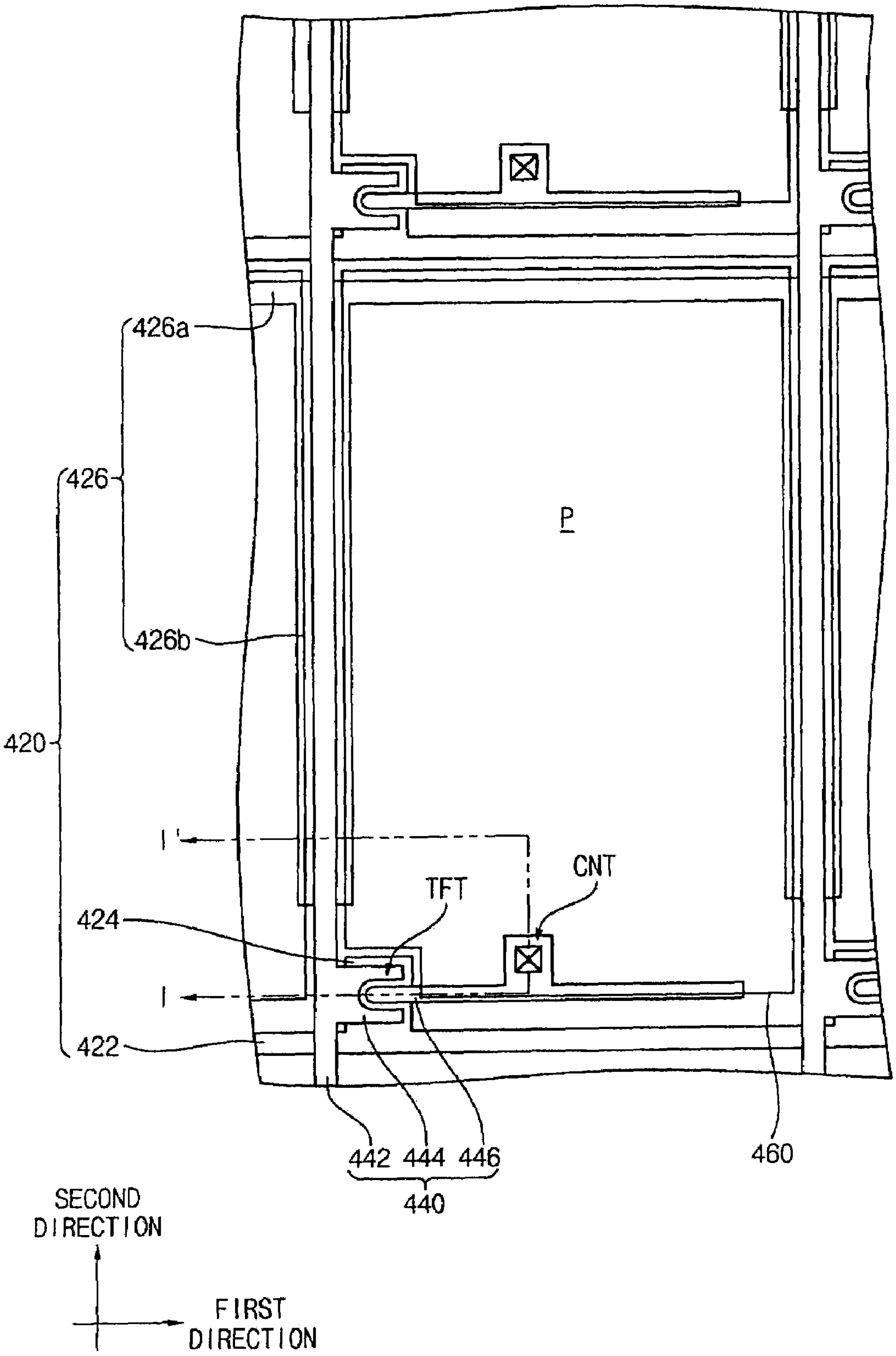
FIG. 2 is a plan view illustrating a display panel in FIG. 1, according to an exemplary embodiment of the present invention.
Figure 3:
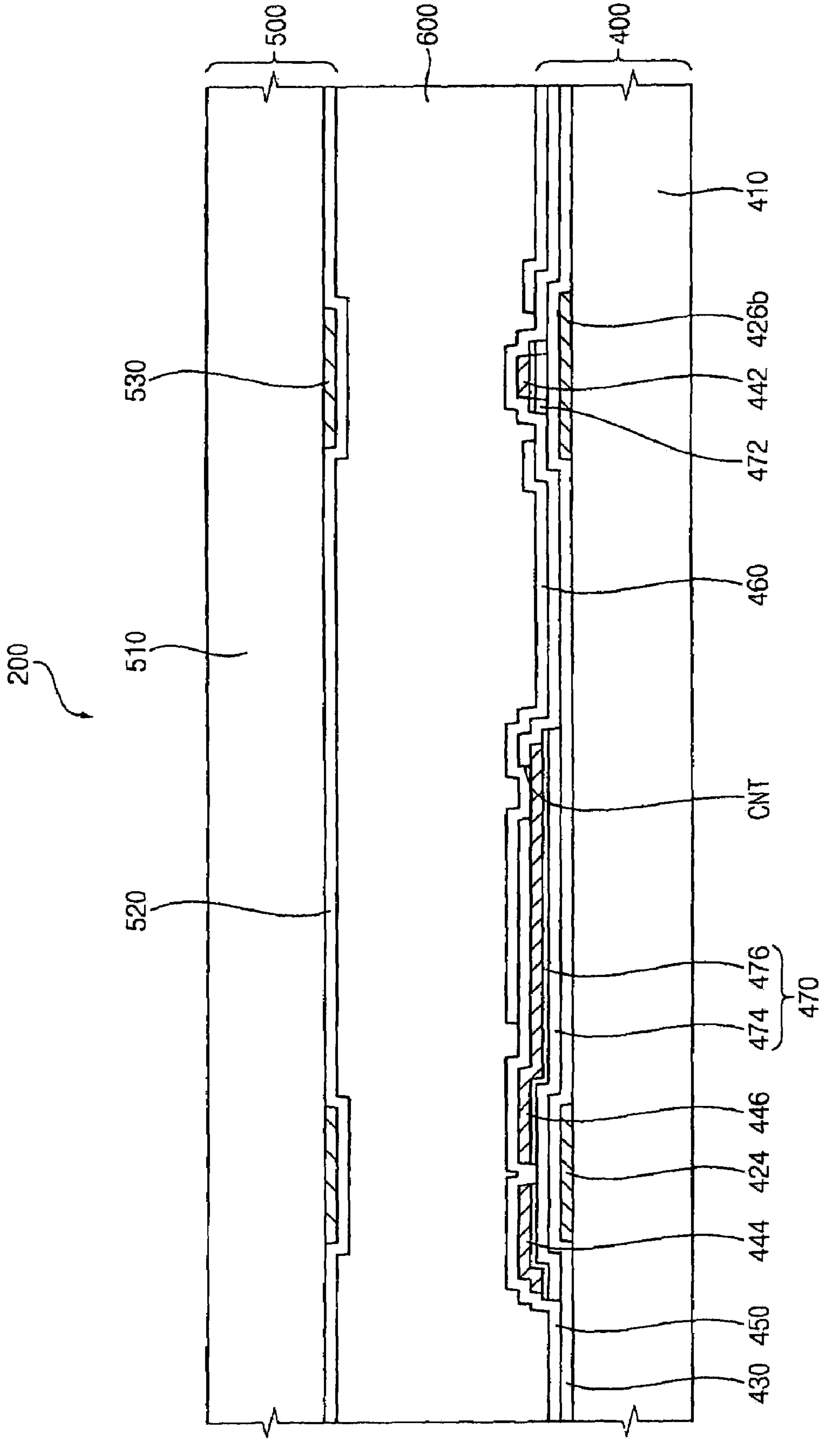
FIG. 3 is a cross-sectional view taken along a line I-I' in FIG. 2.

FIG. 1 is a block diagram illustrating a display apparatus 100 according to an example embodiment of the present invention. FIG. 2 is a plan view illustrating a display panel 200 in FIG. 1. FIG. 3 is a cross-sectional view taken along a line I-I' in FIG. 2.

Referring to FIGS. 1, 2 and 3, the display apparatus 100 includes a display panel 200 which displays an image and a power supplying part 300 which supplies a power source to the display panel 200.

The power supplying part 300 supplies power sources such as a gate signal Vg, a data voltage Vp, a common voltage Vcom, and a storage voltage Vcst which are necessary to drive the display panel 200, to the display panel 200. The gate signal Vg is applied to a gate line 422, and the data voltage Vp is applied to a data line 442. The common voltage Vcom is applied to a common electrode 520, and the storage voltage Vcst is applied to a storage line 426. According to an exemplary embodiment, the power supplying part 300 may be one unit. Alternatively, according to another exemplary embodiment the power supplying part 300 may be divided into a plurality of units, each of which outputs more than one of the above-mentioned power sources.

Figure 4:
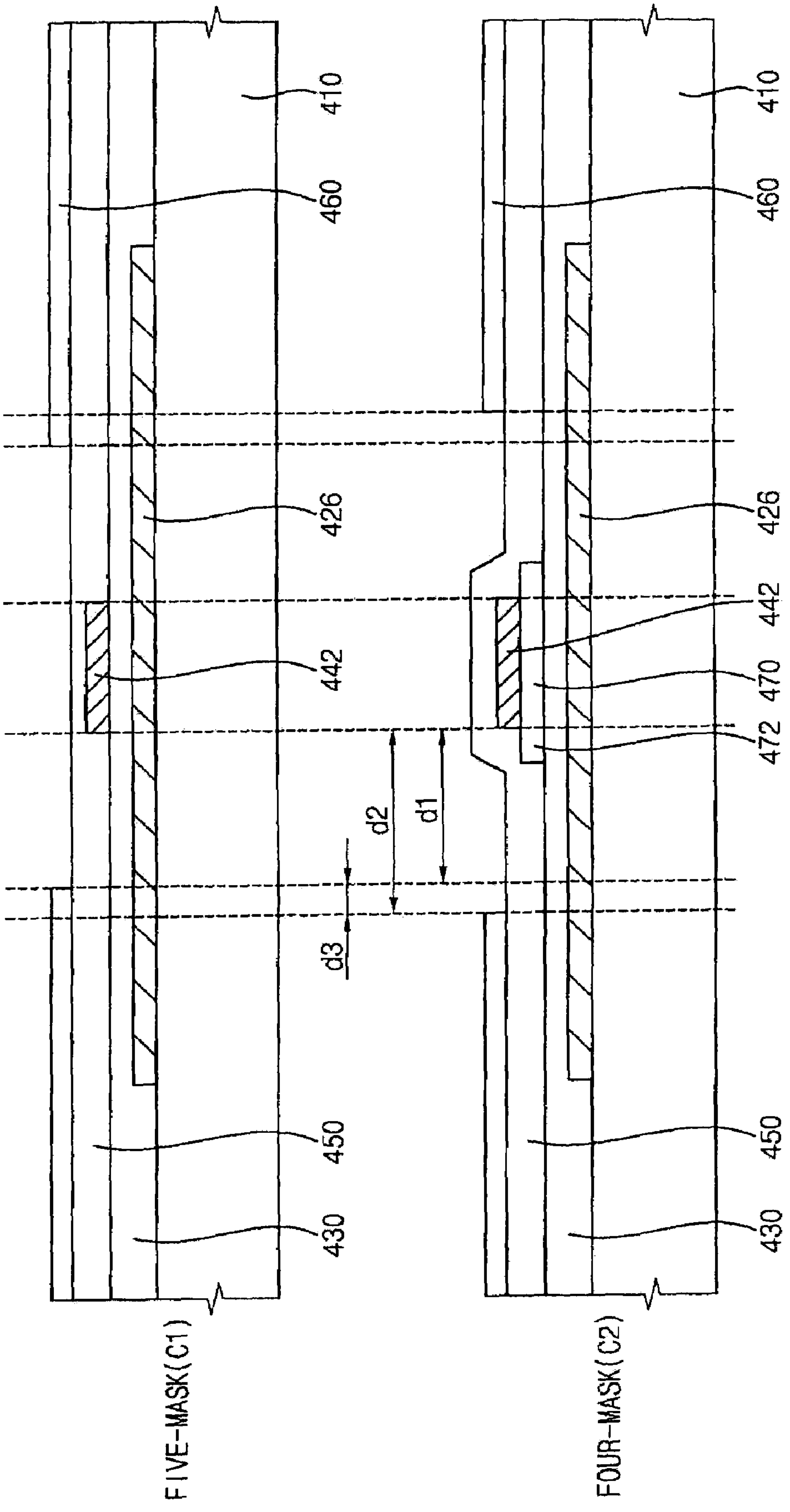
FIG. 4 is a cross-sectional view illustrating an exemplary embodiment of a display substrate formed via a four-mask method and a display substrate formed via a five-mask method according to the present invention.

As shown in FIG. 4, the display panel 200 includes an active layer 470 disposed between the storage line 426 and the data line 442.

The display panel 200 includes a display substrate 400, a counter substrate 500 facing the display substrate 400, and a liquid crystal layer 600 disposed between the display substrate 400 and the counter substrate 500.

The display substrate 400 includes a first metal pattern 420, a first insulating layer 430, an active layer 470, a second metal pattern 440, a second insulating layer 450 and a pixel electrode 460 which are sequentially integrated on the first substrate 410. According to an exemplary embodiment, the first substrate 410 may include a transparent glass or a plastic-based material, however, the present invention is not limited hereto, and may vary as necessary.

The first metal pattern 420 is formed on the first substrate 410, and includes the gate line 422 to which the gate signal Vg is applied, a gate electrode 424 electrically connected to the gate line 422, and a storage line 426 which is electrically separated from the gate line 422 and to which the storage voltage Vcst is applied.

According to an exemplary embodiment, the gate line 422 extends along a first direction.

The gate electrode 424 is electrically connected to the gate line 422 to form a gate terminal of a thin-film transistor ("TFT").

The storage line 426 is electrically separated from the gate lines 422 between the adjacent gate lines 422. The storage line 426 faces the pixel electrode 460. The second insulating layer 450 is interposed between the storage line 426 and the pixel electrode 460, to form a storage capacitor Cst.

According to an exemplary embodiment, the storage line 426 includes a storage portion 426*a* and a light-blocking portion 426*b*.

The storage portion 426*a* extends parallel with the gate lines 422 between the adjacent gate lines 422. According to an exemplary embodiment, the storage portion 426*a* completely overlaps with the pixel electrode 460 in each pixel P. According to an exemplary embodiment, the storage portion 426*a* may have a relatively thinner width to increase an aperture ratio, and is formed adjacent to the gate line 422 located on the upper side of the display substrate.

The light-blocking portion 426*b* extends along the data line 442 from the storage portion 426*a* to overlap with the data line 442. According to an exemplary embodiment, a width of the light-blocking portion 426*b* is larger than that of the data line 442, in order to prevent light from leaking at both sides of the data line 442. In addition, the light-blocking portion 426*b* partially overlaps with the pixel electrode 460 to form the storage capacitor Cst.

Accordingly, the storage line 426 is formed along an edge of each pixel P to form the storage capacitor Cst, so that the aperture ratio may be increased better than when the storage line 426 is formed across a central portion of each pixel P.

According to an exemplary embodiment, the first metal pattern 420 includes a molybdenum/aluminum ("Mo/Al") double-layer structure with aluminum (Al) and molybdenum (Mo) sequentially integrated. Alternatively, according to another exemplary embodiment, the first metal pattern 420 may include a single metal such as aluminum (Al), molybdenum (Mo), neodymium (Nd), chromium (Cr), tantalum (Ta), titanium (Ti), tungsten (W), copper (Cu), silver (Ag) and so on, or an alloy thereof. In addition, according to an exemplary embodiment, the first metal pattern 420 may include a plurality of layers having the single metal or alloy.

The first insulating layer 430 is formed on the first substrate 410 on which the first metal pattern 420 is formed. The first insulating layer 430 is an insulating layer which protects and insulates the first metal pattern 420, and, according to an exemplary embodiment, includes silicon nitride ("SiNx") or silicon oxide ("SiOx"). For example, the first insulating layer 430 may have a thickness between approximately 4,000 Å and approximately 4,500 Å.

The active layer 470 and the second metal pattern 440 are formed on the first insulating layer 430. The active layer 470 and the second metal pattern 440 are formed via a one-mask method, to decrease the number of mask operations. Thus, according to an exemplary embodiment, the active layer 470 includes substantially a same shape as the second metal pattern 440, and is formed between the first insulating layer 430 and the second metal pattern 440.

According to an exemplary embodiment, the second metal pattern 440 is formed via a wet etching operation, and the active layer 470 is formed via a dry etching operation, so that the second metal pattern 440 is more etched than the active layer 470. Thus, the active layer 470 includes an active protrusion portion 472 which protrudes to the outside of the second metal pattern 440.

When the mask to pattern the active layer 470 is different from the mask to pattern the second metal pattern 440, the active layer 470 is formed in a portion overlapping with the gate electrode 424.

According to an exemplary embodiment, the active layer 470 includes a semiconductor layer 474 and an ohmic contact layer 476. The semiconductor layer 474 is a channel through which an electric current flows. The ohmic contact layer 476 decreases a contact resistance between the semiconductor layer 474 and source and drain electrodes 444 and 446. According to an exemplary embodiment, the semiconductor layer 474 includes amorphous silicon ("a-Si"), and the ohmic contact layer 476 includes amorphous silicon doped with n-type dopants at a high concentration ("n+ a-Si").

The second metal pattern 440 includes the data line 442 to which the data voltage Vp is applied (see FIG. 1, for example), and the source and drain electrodes 444 and 446.

The data line 442 extends along a second direction which is perpendicular to the first direction, and is insulated from the gate line 422 by the first insulating layer 430. According the exemplary embodiment, the data line 442 extends along the second direction crossing the gate line 422.

The source electrode 444 extends from the data line 442, to at least partially overlap with the gate electrode 424, and the source electrode 444 forms a source terminal of the thin-film transistor TFT.

The drain electrode 446 is spaced apart from the source electrode 444 by a predetermined distance, and at least partially overlaps with the gate electrode 424. The drain electrode 446 forms a drain terminal of the thin-film transistor TFT. Accordingly, the thin-film transistor TFT which includes the gate electrode 424, the source electrode 444, the drain electrode 446 and the active layer 470, is formed in each pixel P of the display substrate 400. At least one thin-film transistor TFT is formed in each pixel P to drive each pixel P independently. The thin-film transistor TFT transmits the data voltage Vp applied through the data line 442 to the pixel electrode 460 in response to the gate signal Vg.

According to an exemplary embodiment, the second metal pattern 440 includes a molybdenum/aluminum/molybdenum ("Mo/Al/Mo") triple-layer structure having molybdenum (Mo), aluminum (Al) and molybdenum (Mo) sequentially integrated. Alternatively, according to another exemplary embodiment, the second metal pattern 440 includes a single metal such as aluminum (Al), molybdenum (Mo), neodymium (Nd), chromium (Cr), tantalum (Ta), titanium (Ti), tungsten (W), copper (Cu), silver (Ag) and so on, or an alloy thereof. In addition, according to an exemplary embodiment, the second metal pattern 440 may include a plurality of layers having the single metal or alloy.

The second insulating layer 450 is formed on the first substrate 410 on which the second metal pattern 420 is formed. The second insulating layer 450 is an insulating layer which protects and insulates the second metal pattern 440, and for example, includes silicon nitride ("SiNx") or silicon oxide ("SiOx"). For example, the second insulating layer 450 may have a thickness between approximately 1,500 Å and approximately 2,000 Å.

The pixel electrode 460 is formed on the second insulating layer 450 corresponding to each pixel P, and includes a transparent conductive material through which light is transmitted. For example, according to an exemplary embodiment, the pixel electrode 460 includes indium zinc oxide ("IZO") or indium tin oxide ("ITO").

The pixel electrode 460 is electrically connected to the drain electrode 446 through a contact hole CNT formed through the second insulating layer 450. Thus, the data voltage Vp which is transmitted to the drain electrode 446 by turning on the thin-film transistor TFT, may be applied to the pixel electrode 460.

As mentioned, above, according to an exemplary embodiment, the pixel electrode 460 completely overlaps with the storage portion 426*a*, and partially overlaps with the light-blocking portion 426*b*, to form the storage capacitor Cst. The data voltage Vp applied to the pixel electrode 460 by driving the thin-film transistor TFT, is maintained for one frame by the storage capacitor Cst.

According to an exemplary embodiment, the pixel electrode 460 includes a predetermined opening pattern to divide each pixel P into a plurality of domains, so that a light viewing angle of the display panel 200 may be enhanced.

The counter substrate 500 faces the display substrate 400 disposing the liquid crystal layer 600 between the counter substrate 500 and the display substrate 400. According to an exemplary embodiment, the counter substrate 500 includes the common electrode 520 formed on a surface of a second substrate 510 facing the display substrate 400. The common voltage Vcom is applied to the common electrode 520.

The common electrode 520 includes a transparent conductive material to transmit the light. According to an exemplary embodiment, the common electrode 520 includes indium zinc oxide ("IZO") or indium tin oxide ("ITO"), which is the same as that of the pixel electrode 460. The common electrode 520 includes an opening pattern to enhance the light viewing angle.

According to an exemplary embodiment, the counter substrate 500 further includes a black matrix 530. The black matrix 530 is formed at a border portion between pixels P and prevents the light from leaking, so that a contrast ratio is enhanced.

According to an exemplary embodiment, the counter substrate 500 may further include a color filter layer (not shown) to display a color image. The color filter layer may include a red color filter, a green color filter and a blue color filter sequentially arranged to respectively correspond to pixels P.

Liquid crystals having optical and electrical characteristics, such as an anisotropic refractive index and an anisotropic dielectric ratio, are regularly arranged in the liquid crystal layer 600. An arrangement direction of the liquid crystals is changed by an electric field generated from a difference between the data voltage Vp applied to the pixel electrode 460 and the common voltage Vcom applied to the common electrode 520, so that the liquid crystal layer controls a transmissivity of the light passing through the liquid crystals.

As mentioned above, when the active layer 470 is disposed between the storage line 426 and the data line 442 and the active protrusion portion 472 protrudes to the outside of the data line 442. According to an exemplary embodiment, the data line 442 may be more spaced apart from the pixel electrode 460 as the active layer 470 is more activated.

FIG. 4 is a cross-sectional view illustrating a display substrate formed via a four-mask method and a display substrate formed via a five-mask method.

Referring to FIG. 4, when the display substrate 400 is manufactured via the five-mask method C1, the active layer 470 is not formed under the data line 442, so that the pixel electrode 460 is spaced apart from the data line 442 by a first distance d1, to minimize parasitic capacitance generated between the pixel electrode 460 and the data line 442.

However, when the display substrate 400 is manufactured via the four-mask method C2, the active layer 470 is formed under the data line 442 and the active layer 470 includes the active protrusion portion 472 which protrudes to the outside of the data line 442. When a predetermined storage voltage Vcst is applied to the storage line 426 to drive the display substrate 400, the active layer 470 is completely activated to be the conductor. When the active layer 470 is the conductor, the pixel electrode 460 is spaced apart from the data line 442 by a second length d2 which is a sum of the first length d1 and a third length d3 corresponding to the length of the active protrusion portion 472, to minimize the parasitic capacitance generated between the pixel electrode 460 and the data line 442. Thus, the aperture ratio is decreased by as much as a decrease of an area of the pixel electrode 460.

The active layer 470 is activated based on the storage voltage Vcst applied to the storage line 426. Thus, the distance between the pixel electrode 460 and the data line 442 is decreased by controlling the storage voltage Vcst applied to the storage line 426, to increase the aperture ratio.

Figure 5:
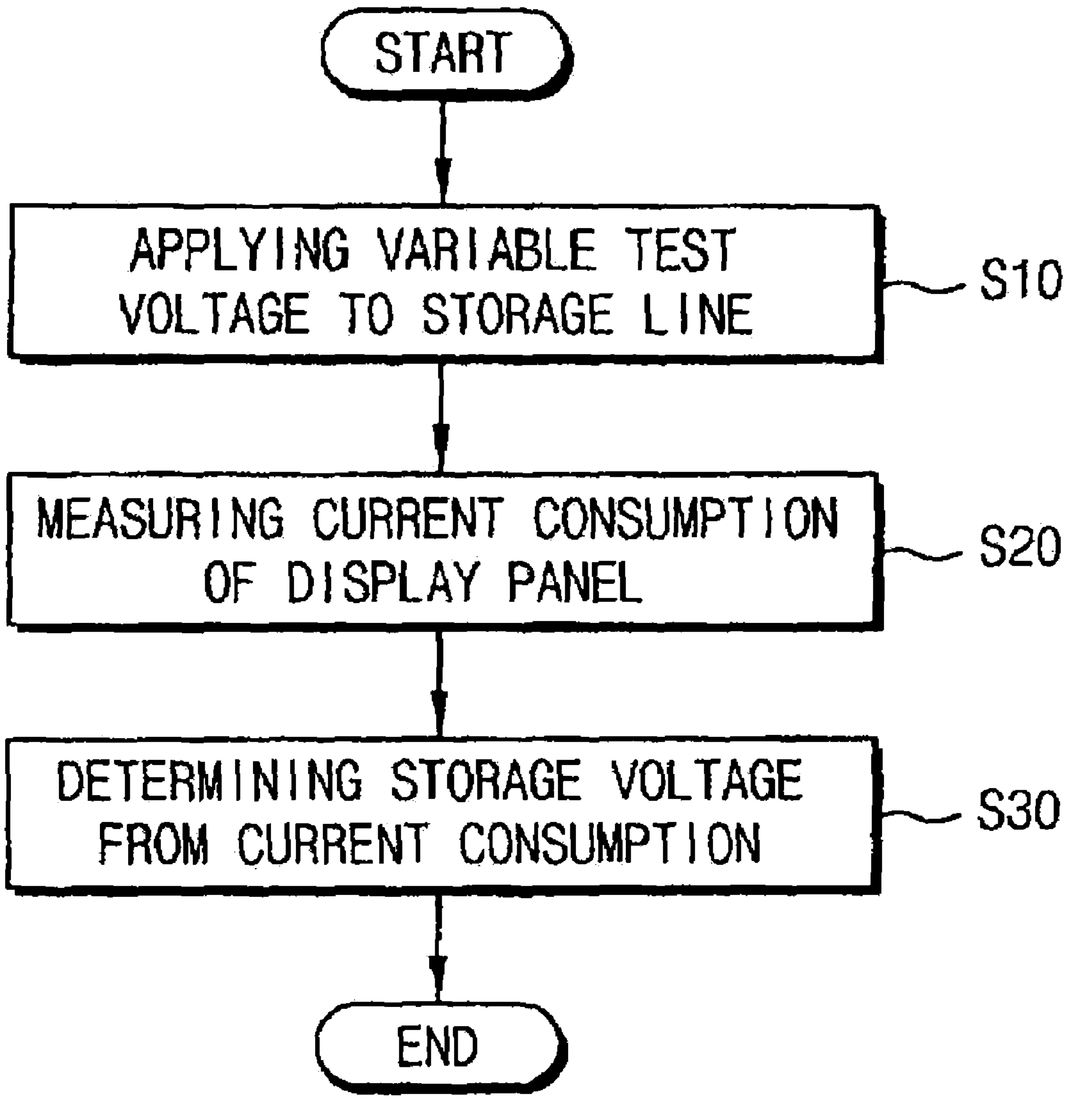
FIG. 5 is a flow chart illustrating an exemplary embodiment of a method for detecting a storage voltage to decrease a distance between a pixel electrode and a data line, according to the present invention.

FIG. 5 is a flow chart illustrating a method for detecting a storage voltage to decrease a distance between a pixel electrode 460 and a data line 442.

Referring to FIGS. 4 and 5, a test voltage which is continuously varied is applied to the storage line 426, so that the storage voltage Vcst is detected in the display panel 200 having the active layer 470 disposed between the storage line 426 and the data line 442 (operation S10). For example, the test voltage having a range between approximately −20 V and approximately 20 V, may be applied.

Then, current consumption of the display panel 200 which is changed as the test voltage applied to the storage line 426 is changed, is measured (operation S20).

Figure 6:
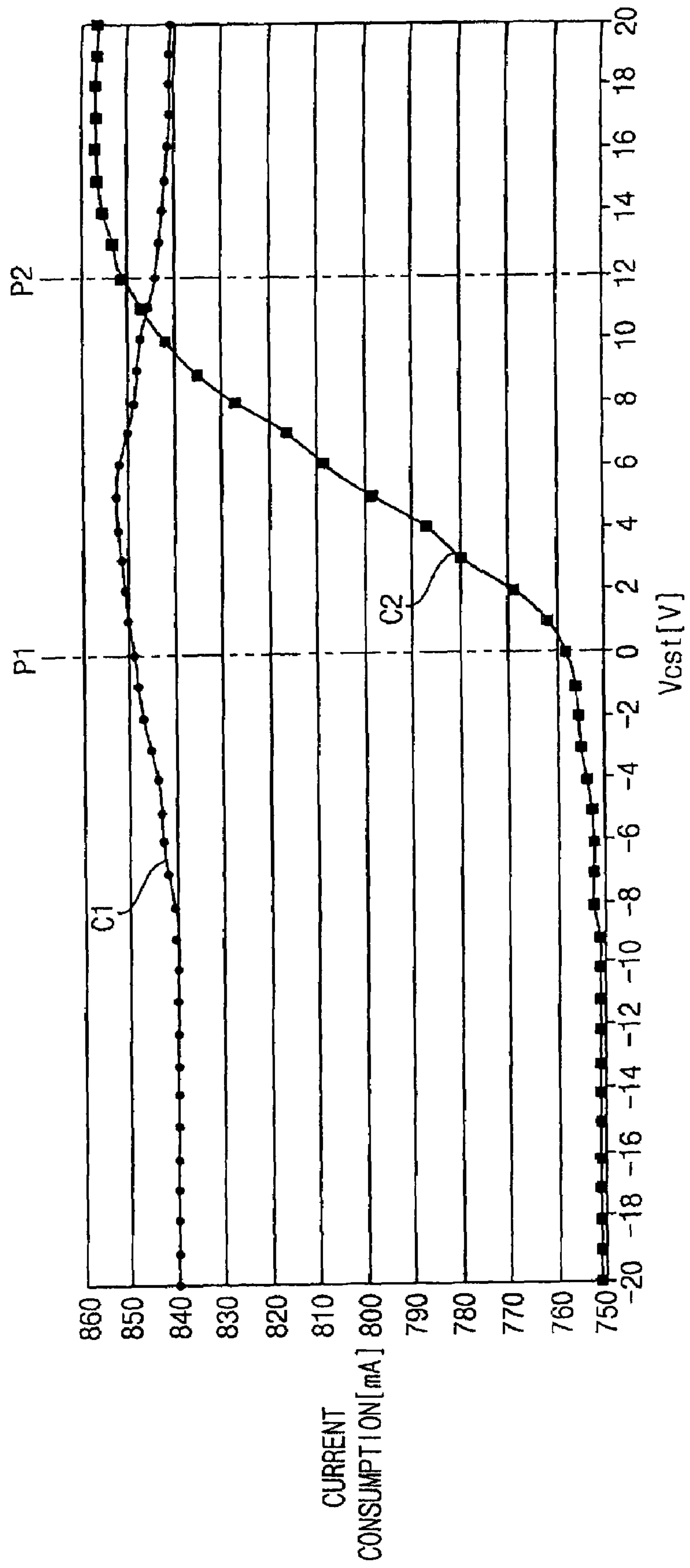
FIG. 6 is a graph illustrating an exemplary embodiment of current consumption of the display panel which is changed according to a change of a test voltage, according to the present invention.

FIG. 6 is a graph illustrating current consumption of the display panel which is changed according to a change of a test voltage.

Referring to FIGS. 4 and 6, when the active layer 470 is not formed between the storage line 426 and the data line 442 (C1), the current consumption is hardly changed as the test voltage is changed.

However, when the active layer 470 is formed between the storage line 426 and the data line 442 (C2), the current consumption is hardly increased to a first point P1, the current consumption is rapidly increased from the first point P1 to a second point P2 and then the current consumption is saturated from the second point P2 as the test voltage is increased.

Then, the storage voltage Vcst is determined from the measured current consumption (operation S30).

Generally, the current consumption of the display panel is affected by the capacitance of the data line 442. According to an exemplary embodiment, the current consumption may be increased as the capacitance of the data line 442 is increased, and the current consumption may be decreased as the capacitance of the data line 442 is decreased. In addition, the capacitance of the data line 442 is affected by the parasitic capacitance generated between the data line 442 and the pixel electrode 460.

As illustrated in FIG. 6, when the active layer 470 is not formed between the storage line 426 and the data line 442 (C1), the data line 442 maintains a constant distance with the pixel electrode 460, so that the parasitic capacitance generated between the data line 442 and the pixel electrode 460 is hardly changed. Thus, the parasitic capacitance of the data line 442 is hardly changed, so that the current consumption is hardly changed although the storage voltage Vcst is changed.

However, when the active layer 470 is formed between the storage line 426 and the data line 442 (C2), the current consumption is considerably changed according as the active layer 470 is activated based on the storage voltage Vcst.

According to an exemplary embodiment, the active layer 470 may be activated according to a level of the storage voltage Vcst applied to the storage line 426 that is disposed adjacent to the active layer 470. The active layer 470 may be in an active state in which the active layer 470 is fully activated and is the conductor, an active progress state in which the active layer 470 is being activated, and an inactive state having an insulating state in which the active layer 470 is not activated.

When the active layer 470 is in the active state, the active state 470 is the conductor, so that the distance between the active layer 470 and the pixel electrode 460 is decreased by the length of the active protrusion portion 472 and the capacitance of the data line 442 is increased. Thus, the current consumption may be increased.

However, when the active layer 470 is in the inactive state, the active layer has no effect on the capacitance of the data line 442, so that the distance between the active layer 470 and the pixel electrode 460 is increased by as much as the length of the active protrusion portion 472. Thus, the current consumption may be decreased. In addition, when the active layer 470 is in the inactive state as when the active layer 470 is not formed between the storage line 426 and the data line 442, the distance between the pixel electrode 460 and the data line 442 is preset to be the first distance d1. Thus, the aperture ratio may be increased.

Furthermore, when the active layer 470 is in the inactive state, the distance between the storage line 426 and the data line 442 is increased by as much as the thickness of the active layer 470, so that the capacitance of the data line 442 is more decreased. Thus, the current consumption may be more decreased.

The active layer 470 is in a progress from the inactive state to the active state when the active layer 470 is in the active progress state, so that the current consumption is rapidly increased according as the active layer 470 is activated. When the active layer 470 is in the active progress state, the aperture ratio may be increased and the current consumption may be increased more than when the active layer 470 is in the active state.

Accordingly, the active layer 470 is activated as the test voltage applied to the storage line 426 is changed, so that the current consumption of the display panel 200 is changed and a range of the storage voltage Vcst is determined from the changed current consumption. For example, when the active layer 470 is activated as the test voltage is changed, the storage voltage Vcst of the test voltage included in an inactive period in which the active layer 470 is in the inactive state may be determined, and the determined storage voltage Vcst may be applied to the display panel 200, so that the aperture ratio may be increased and the current consumption may be decreased.

According to an exemplary embodiment, when determining the storage voltage Vcst, the voltage substantially a same as or lower than the test voltage corresponding to the second point P2 in which the current consumption which is saturated as the test voltage is decreased, is rapidly decreased, may be determined as the storage voltage Vcst. For example, the storage voltage Vcst is preset, so that the active layer 470 is in the active progress state and the insulating state substantially corresponding to the inactive state. Thus, the aperture ratio may be increased and the current consumption may be decreased more than when the active layer 470 is in the active state. According to an exemplary embodiment, the storage voltage Vcst may be preset to be under approximately 12 V corresponding to the second point P2 in FIG. 6. However, according to another exemplary embodiment, the storage voltage Vcst is determined in a range between approximately −12 V and approximately 12 V, considering the measurement results in FIG. 6.

According to another exemplary embodiment, when determining the storage voltage Vcst, the voltage substantially the same as or lower than the test voltage corresponding to the first point P1 in which the current consumption which is rapidly decreased as the test voltage is decreased, is saturated, may be determined as the storage voltage Vcst. According to another exemplary embodiment, the storage voltage Vcst is preset, so that the active layer 470 is substantially in the inactive state. Thus, the aperture ratio may be increased and the current consumption may be decreased more than when the active layer is in the active state and in the active progress state. According to an exemplary embodiment, the storage voltage Vcst is preset to be under approximately 0 V corresponding to the first point P1 in FIG. 6. According to another exemplary embodiment, the storage voltage Vcst is preset to be in a range between approximately −7 V and approximately 7 V, so that the storage voltage Vcst may be used for the gate-off voltage Voff or the common voltage Vcom that is often used in the display panel 200, at the same time.

Then, referring to FIG. 1, a method for driving the display apparatus using the storage voltage Vcst detected by the detecting method mentioned above, will be explained. A portion (A) is an equivalent circuit diagram of each pixel.

Referring to FIGS. 1 and 3, the power sources such as the gate signal Vg, the data voltage Vp, the common voltage Vcom, the storage voltage Vcst and so on, are transmitted to the display panel 200 from the power supplying part 300, to drive the display panel 200.

The gate signal Vg provided from the power supplying part 300 is applied to the gate line 422, to turn on the thin-film transistor TFT.

At the same time, the data voltage Vp is applied to the data line 442 that overlaps with the active layer 470 and the storage line 426, so that the data voltage Vp that is provided from the power supplying part 300 when the thin-film transistor TFT is turned on, is transmitted to the pixel electrode 460.

In addition, the storage voltage Vcst in a range between approximately −20 V and approximately 12 V is applied to the storage line 426 forming the pixel electrode 460 and the storage capacitor Cst, to maintain the data voltage Vp transmitted to the pixel electrode 460 by turning on the thin-film transistor TFT. The storage voltage Vcst is detected by the method for detecting the storage voltage mentioned above, and is in the range of the voltage in which the active layer 470 is substantially in the inactive state. The storage voltage Vcst may be in a range between approximately −20 V and approximately 0 V in which the active layer 470 is substantially in the insulating state.

The pixel electrode 460 and the common electrode 520 which face each other disposing the liquid crystal layer 600 therebetween, form a liquid crystal capacitor Clc (shown in FIG. 1). The arrangement direction of the liquid crystals is changed by the electric field generated by the difference between the data voltage Vp applied to the pixel electrode 460 and the common voltage Vcom applied to the common electrode 520, and the liquid crystal layer 600 controls the transmissivity of the light passing through the liquid crystals. Thus, the arrangement direction of the liquid crystals is changed, so that the display panel 200 controls the light transmissivity to display the image.

According to an exemplary embodiment, a storage voltage in which an active layer is substantially in an inactive state, is detected in a display panel 200 having the active layer 470 disposed between a storage line 426 and a data line 442. The display panel 200 is driven by using the detected storage voltage Vcst, so that an aperture ratio may be increased and current consumption may be decreased.

While the present invention has been shown and described with reference to some exemplary embodiments thereof, it should be understood by those of ordinary skill in the art that various changes in form and details may be made therein without departing from the spirit and scope of the present invention as defined by appending claims.

What is claimed is:

1. A display apparatus comprising:

a display substrate having an active layer disposed between a storage line and a data line overlapping the storage line; and a power supplying part which supplies a storage voltage to the storage line, the active layer being in an inactive state by the storage voltage.

2. The display apparatus of claim 1, wherein the storage voltage is in a range between approximately −20 V and approximately 12 V.

3. The display apparatus of claim 2, wherein the display substrate comprises:

a first metal pattern formed on a substrate, and comprising a gate line and the storage line, the gate line receives a gate signal provided from the power supplying part;

a first insulating layer formed on the substrate on which the first metal pattern is formed;

a second metal pattern formed on the first insulating layer, and comprising a data line at least partially overlapping with the storage line and receiving a data signal supplied from the power supplying part;

a second insulating layer formed on the substrate on which the second metal pattern is formed; and a pixel electrode formed on the second insulating layer corresponding to each pixel, and partially overlapping with the storage line.

4. The display apparatus of claim 3, wherein the active layer is formed between the first insulating layer and the second metal pattern.

5. The display apparatus of claim 4, wherein the active layer comprises an active protrusion portion which protrudes to an outside of the second metal pattern.

6. The display apparatus of claim 5, wherein the storage line comprises:

a storage portion which extends parallel with the gate line; and a light-blocking portion which extends along the data line from the storage portion to overlap with the data line.

7. The display apparatus of claim 6, wherein a width of the light-blocking portion is larger than that of the data line and that of the active layer.

8. The display apparatus of claim 6, wherein the storage portion completely overlaps with the pixel electrode in each pixel.

9. The display apparatus of claim 6, wherein the storage portion comprises a thin width and is formed adjacent to the gate line located in an upper side of the display substrate.

10. The display apparatus of claim 4, wherein the active layer is a same shape as the second metal pattern.

11. The display apparatus of claim 3, wherein the storage line is formed along an edge of each pixel to form a storage capacitor.

12. The display apparatus of claim 2, wherein the storage voltage is in a range between approximately −20 V and approximately 0 V.

13. The display apparatus of claim 12, wherein the storage voltage is in a range between approximately −7 V and approximately −1 V.

* * * * *